United States Patent
Kim et al.

(10) Patent No.: US 7,767,502 B2
(45) Date of Patent: Aug. 3, 2010

(54) METHOD FOR MANUFACTURING ELECTRONIC DEVICE USING THIN FILM TRANSISTOR WITH PROTECTIVE CAP OVER FLEXIBLE SUBSTRATE

(75) Inventors: Do-young Kim, Suwon-si (KR); Wan-jun Park, Seoul (KR); Young-soo Park, Suwon-si (KR); June-key Lee, Suwon-si (KR); Yo-sep Min, Suwon-si (KR); Jang-yeon Kwon, Seoul (KR); Sun-ae Seo, Seoul (KR); Young-min Choi, Osan-si (KR); Soo-doo Chae, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 688 days.

(21) Appl. No.: 11/702,057

(22) Filed: Feb. 5, 2007

(65) Prior Publication Data
US 2007/0172999 A1    Jul. 26, 2007

Related U.S. Application Data

(62) Division of application No. 10/748,271, filed on Dec. 31, 2003, now Pat. No. 7,176,488.

(30) Foreign Application Priority Data
Dec. 31, 2002    (KR) ............................... 2002-87940

(51) Int. Cl.
H01L 21/84    (2006.01)
H01L 21/00    (2006.01)

(52) U.S. Cl. ............ 438/149; 438/151; 438/154; 257/66; 257/E21.291

(58) Field of Classification Search .................. None
See application file for complete search history.

(56) References Cited

U.S. PATENT DOCUMENTS 6,329,226 B1    12/2001    Jones et al.

(Continued)

FOREIGN PATENT DOCUMENTS

CN    1 311 522    9/2001

(Continued)

OTHER PUBLICATIONS

Patent Abstracts of Japan, vol. 2003, No. 12, (Dec. 5, 2003) & JP 2003 255857 Nippon Hoso Kyokai <NHK>.

(Continued)

Primary Examiner—Zandra Smith
Assistant Examiner—Khanh B Duong
(74) Attorney, Agent, or Firm—Harness, Dickey & Pierce, PLC

(57) ABSTRACT

In a thin film semiconductor device realized on a flexible substrate, an electronic device using the same, and a manufacturing method thereof, the thin film semiconductor device and an electronic device include a flexible substrate, a semiconductor chip, which is formed on the flexible substrate, and a protective cap, which seals the semiconductor chip. Durability of the thin film semiconductor device against stress due to bending of the substrate is improved by using the protective cap.

17 Claims, 19 Drawing Sheets

U.S. PATENT DOCUMENTS

| | | |
|---|---|---|
| 6,633,121 B2 | 10/2003 | Eida et al. |
| 6,916,681 B2 | 7/2005 | Asano et al. |
| 6,992,439 B2 * | 1/2006 | Yamazaki et al. .......... 313/512 |
| 2001/0017372 A1 | 8/2001 | Koyama |
| 2001/0050532 A1 | 12/2001 | Eida et al. |
| 2002/0036267 A1 | 3/2002 | Ikeda et al. |
| 2002/0057055 A1 | 5/2002 | Yamazaki et al. |
| 2002/0097362 A1 | 7/2002 | Yamada et al. |
| 2002/0155729 A1 | 10/2002 | Baldwin et al. |
| 2003/0107688 A1 | 6/2003 | Yamagishi |
| 2005/0205868 A1 | 9/2005 | Yamazaki et al. |

FOREIGN PATENT DOCUMENTS

| | | |
|---|---|---|
| CN | 1 358 404 | 7/2002 |
| JP | 2000-101091 | 4/2000 |
| KR | 2001-0084247 | 9/2001 |
| KR | 10-0390457 | 7/2003 |

OTHER PUBLICATIONS

Hur, Ji Ho, et al., "Late-News Paper: A 2 inch A-Si:H TFT-LCD on Plastic", 2002 SID International Symposium Digest of Technical Papers, Boston, MA (US), May 21-23, 2002 [SID 02 Digest] vol. 33, No. 2, pp. 802-805 (May 2002).

Suo, Z., et al., "Mechanics of rollable and foldable fillm-on-foil electronics" Applied Physics Letters, vol. 74, No. 8, pp. 1177-1179, (Feb. 22, 1999).

* cited by examiner

METHOD FOR MANUFACTURING ELECTRONIC DEVICE USING THIN FILM TRANSISTOR WITH PROTECTIVE CAP OVER FLEXIBLE SUBSTRATE

CROSS REFERENCE TO RELATED APPLICATION(S)

This is a divisional application based on pending application Ser. No. 10/748,271, filed Dec. 31, 2003 now U.S. Pat. No. 7,176,488, the entire contents of which is hereby incorporated by reference.

BACKGROUND OF THE INVENTION

1. Field of the Invention

The present invention relates to a thin film semiconductor device, an electronic device using the same, and a manufacturing method thereof. More particularly, the present invention relates to a thin film semiconductor device with improved durability to be mounted on a flexible substrate, an electronic device using the same, and a manufacturing method thereof.

2. Description of the Related Art

Conventional flat panel display devices, such as a thin film transistor-liquid crystal display (TFT-LCD) and a thin film transistor-organic light emitting diode (TFT-OLED), generally form thin film semiconductor devices of amorphous silicon-TFT or polysilicon-TFT on glass substrates. Recently, studies on the possibility of substituting flexible substrates, such as plastic substrates, for the glass substrates of the flat panel display devices have been performed. A flexible substrate for a flat panel display device has advantages of durability, lightweight, and flexibility so that the flexible substrate may be used for a mobile device. However, in a case in which semiconductor chips are formed on a flexible substrate, the semiconductor chips may be broken due to bending or folding of the flexible substrate. A conventional TFT-LCD includes a polysilicon-TFT formed of an inorganic thin film. In this case, since the elastic coefficient of a TFT portion is large, the TFT-LCD may be easily broken when the TFT is slightly transformed due to bending of the flexible substrate. However, since the TFT occupies about 1% of the entire area of a unit pixel, transformation of the TFT should be prevented in order to prevent breakage of the semiconductor device due to transformation of the TFT by the bending of the flexible substrate.

FIG. 1 illustrates a sectional view of a conventional TFT-LCD for preventing deformation of a TFT.

Referring to FIG. 1, a structure is formed in a substrate of a flexible acrylate copolymer film 1, and a gate electrode 5 is formed on a lower portion of a cradle. An insulating layer 6 formed of a dielectric material, such as silicon nitride (SiN) or silicon oxide ($SiO_2$), is formed on an upper surface of the substrate 1 including the gate electrode 5. An active layer 10, which is formed of an amorphous silicon, is formed on a portion of the insulating layer 6 on the gate electrode 5. In addition, silicon layers 12 and 13 that are doped of n-type or p-type ions are formed on corners of the active layer 10 and the insulating layer 6 on the gate electrode 5 in order to expose the active layer 10. A drain electrode 14 and a source electrode 15 are formed on the doped silicon layers 12 and 13, respectively. A first metal 16 is connected to the drain electrode 14 to extend the drain electrode 14. A second metal 17 is connected to the source electrode 15 to connect the source electrode 15 to a wall of the structure. A dielectric material 18 that planarizes the substrate 1 is formed on the entire structure.

The conventional TFT includes the cradle structure to disperse stress due to bending of the substrate 1. However, external stress is concentrated on the thin film due to the high elastic coefficient of the thin film that forms the TFT, so the dispersion of the stress due to the cradle structure is slight. More particularly, the conventional TFT cannot supplement the material property of the TFT, so the durability of the electronic device including the TFT cannot be improved.

SUMMARY OF THE INVENTION

The present invention provides a thin film semiconductor device having a structure capable of preventing breakage of the thin film semiconductor when a flexible substrate is bent, an electronic device using the same, and a manufacturing method thereof.

In accordance with a first feature of an embodiment of the present invention, there is provided a thin film semiconductor device including a flexible substrate, a semiconductor chip, which is formed on the flexible substrate, and a protective cap, which seals the semiconductor chip.

The tensile strength of the protective cap is preferably greater than about 30 GPa. The hardness of the protective cap is preferably greater than about 200 Brinell. The protective cap is preferably formed on an upper surface of the semiconductor device. Alternately, the protective cap may be formed on an upper surface of the semiconductor chip and between the semiconductor chip and the flexible substrate.

The semiconductor chip is preferably one selected from the group consisting of a thin film transistor (TFT), a thin film diode (TFD), and a metal insulator metal (MIM).

The protective cap is preferably formed of one selected from the group consisting of an ultraviolet curing resin, an X-ray curing material, an electronic beam curing material, and an ion beam curing material.

The flexible substrate is preferably formed of one selected from the group consisting of plastic and a thin metal film.

The flexible substrate may, however, be a glass substrate having a thickness less than about 100 μm.

In accordance with a second feature of an embodiment of the present invention, there is provided an electronic device including a flexible substrate and a semiconductor chip formed on the flexible substrate, the electronic device including a protective cap that seals the semiconductor chip.

The tensile strength of the protective cap is preferably greater than about 30 GPa. The hardness of the protective cap is preferably greater than about 200 Brinell. The protective cap may be formed on an upper surface of the semiconductor chip or on an upper surface of the semiconductor chip and between the semiconductor chip and the flexible substrate.

The semiconductor chip is preferably one selected from the group consisting of a thin film transistor (TFT), a thin film diode (TFD), and a metal insulator metal (MIM).

The protective cap is preferably formed of one selected from the group consisting of an ultraviolet curing resin, an X-ray curing material, an electronic beam curing material, and an ion beam curing material.

The flexible substrate is preferably formed of one selected from the group consisting of plastic and a thin metal film.

The flexible substrate may, however, be a glass substrate having a thickness less than about 100 μm.

The electronic device may further include a liquid crystal display (LCD) or an organic light emitting diode (OLED) connected to the semiconductor chip.

In accordance with a third feature of an embodiment of the present invention, there is provided a manufacturing method of an electronic device, including (a) manufacturing a thin film semiconductor chip on a flexible substrate, (b) coating a protective cap to seal the semiconductor chip, (c) depositing an insulating layer on the substrate to cover the protective cap, (d) forming a contact hole that penetrates the insulating layer and the protective cap, and (e) forming an electrode to be electrically connected to the semiconductor chip through the contact hole, and forming a driving unit on the electrode, the driving unit being driven by the semiconductor chip.

In the method, (b) preferably includes spin coating the ultraviolet curing resin onto the semiconductor chip, baking the ultraviolet curing resin at a low temperature and radiating ultraviolet rays to a predetermined portion of the ultraviolet curing resin to cure a portion of the ultraviolet curing resin, and performing a development process to remove the remaining ultraviolet curing resin, and performing a heating process at a high temperature to form the protective cap.

Also in the method, (c) preferably includes depositing an insulating layer on the substrate after performing an argon plasma process on the protective cap.

In accordance with a fourth feature of an embodiment of the present invention, there is provided a manufacturing method of an electronic device including (a) manufacturing a thin film semiconductor chip on a flexible substrate, (b) coating a protective cap to seal the semiconductor chip, (c) forming a contact hole that penetrates the protective cap in the upper surface of the semiconductor chip, and (d) forming an electrode to be electrically connected to the semiconductor chip through the contact hole, and forming a driving unit on the electrode, the driving unit being driven by the semiconductor chip.

In the method, (b) preferably includes spin coating the ultraviolet curing resin on the semiconductor chip, baking the ultraviolet curing resin at a low temperature and radiating ultraviolet rays to a predetermined portion of the semiconductor chip to cure a portion of the ultraviolet curing resin, and performing a development process to remove the remaining ultraviolet curing resin, and performing a heating process at a high temperature to form the protective cap.

In accordance with a fifth feature of an embodiment of the present invention, there is provided a manufacturing method of an electronic device including (a) coating a first protective cap on a flexible substrate and patterning the first protective cap into a predetermined pattern, (b) manufacturing a thin film semiconductor chip on the first protective cap, (c) coating a second protective cap on the substrate to seal the semiconductor chip, (d) depositing an insulating layer on the second protective cap and the substrate, (e) forming a contact hole that penetrates the insulating layer and the second protective cap, and (f) forming an electrode to be electrically connected to the semiconductor chip through the contact hole, and forming a driving unit on the electrode, the driving unit being driven by the semiconductor chip.

The ultraviolet curing resin is preferably one selected from the group consisting of an acrylic resin and an epoxy resin.

In the method, (a) preferably includes spin coating an ultraviolet curing resin on the substrate, baking the ultraviolet curing resin at a low temperature and radiating ultraviolet rays to a predetermined portion of the substrate to cure a portion of the ultraviolet curing resin, and performing a development process to remove the remaining ultraviolet curing resin, and performing a heating process at a high temperature to pattern the first protective cap.

Also in the method, (b) preferably includes manufacturing the thin film semiconductor chip after performing an argon plasma process on the first protective cap.

In addition, (c) preferably includes spin coating an ultraviolet curing resin on the semiconductor chip, baking the ultraviolet curing resin at a low temperature and radiating ultraviolet rays to a predetermined portion of the semiconductor chip to cure a portion of the ultraviolet curing resin, and performing a development process to remove the remaining ultraviolet curing resin, and performing a heating process at a high temperature to form the second protective cap.

Preferably, (d) includes depositing the insulating layer after performing an argon plasma process on the second protective cap.

In accordance with a sixth feature of an embodiment of the present invention, there is provided a manufacturing method of an electronic device including (a) coating a first protective cap on a flexible substrate and patterning the first protective cap into a predetermined pattern, (b) manufacturing a thin film semiconductor chip on the first protective cap, (c) coating a second protective cap on the substrate to seal the semiconductor chip, (d) forming a contact hole that penetrates the second protective cap, and (e) forming an electrode to be electrically connected to the semiconductor chip through the contact hole, and forming a driving unit on the electrode, the driving unit being driven by the semiconductor chip.

In the method, (a) preferably includes spin coating an ultraviolet curing resin on the substrate, baking the ultraviolet curing resin at a low temperature and radiating ultraviolet rays to a predetermined portion of the substrate to cure a portion of the ultraviolet curing resin, and performing a development process to remove the remaining ultraviolet curing resin, and performing a heating process at a high temperature to pattern the first protective cap.

In the method, (b) preferably includes manufacturing the thin film semiconductor chip after performing an argon plasma process on the first protective cap.

In the method, (c) preferably includes spin coating the ultraviolet curing resin on the semiconductor chip, baking the ultraviolet curing resin at a low temperature and radiating ultraviolet rays to a predetermined portion of the semiconductor chip to cure a portion of the ultraviolet curing resin, and performing a development process to remove the remaining ultraviolet curing resin, and performing a heating process at a high temperature to form the second protective cap.

In all of the foregoing manufacturing methods, the tensile strength of the protective cap or caps is preferably greater than about 30 GPa and the hardness of the protective cap or caps is preferably greater than about 200 Brinell. The flexible substrate is preferably formed of one selected from the group consisting of plastic and a thin metal film. Alternately, the flexible substrate may be a glass substrate having a thickness less than about 100 μm. The semiconductor chip is preferably one selected from the group consisting of a thin film transistor (TFT), a thin film diode (TFD), and a metal insulator metal (MIM). The driving unit may be a pixel unit of an LCD or a pixel unit of an OLED. The protective cap or caps is preferably formed of one selected from the group consisting of an ultraviolet curing resin, an X-ray curing material, an electronic beam curing material, and an ion beam curing material.

The present invention seals the semiconductor chip using an inorganic thin film by using the protective cap to improve the durability of the thin film semiconductor device and the electronic device using the same.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
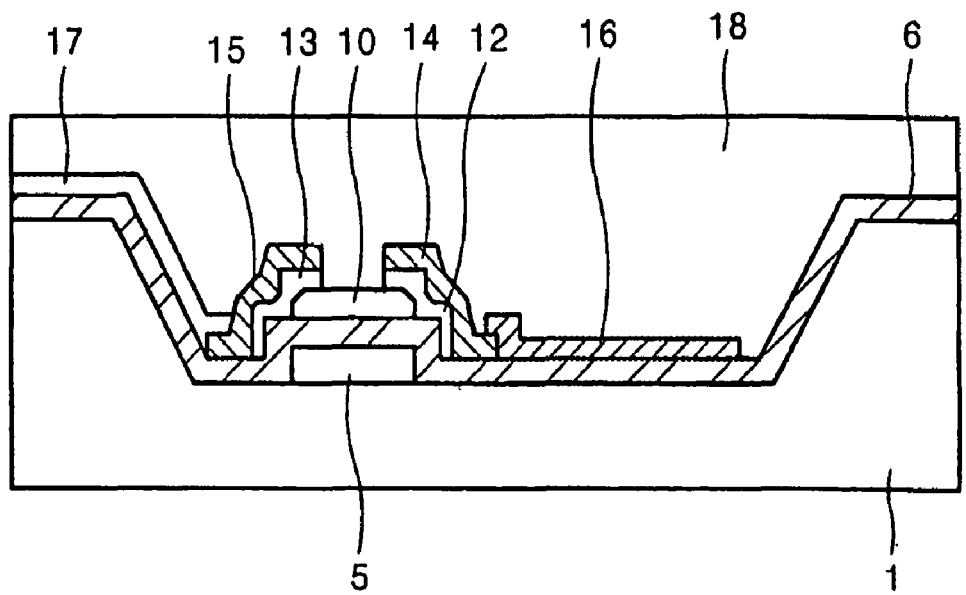
FIG. 1 illustrates a sectional view of a conventional thin film transistor-liquid crystal display (TFT-LCD)

Korean Patent Application No. 2002-87940, filed on Dec. 31, 2002, and entitled: "Thin Film Transistor with Protective Cap Over Flexible Substrate, Electronic Device Using the Same, and Manufacturing Method Thereof," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 2:
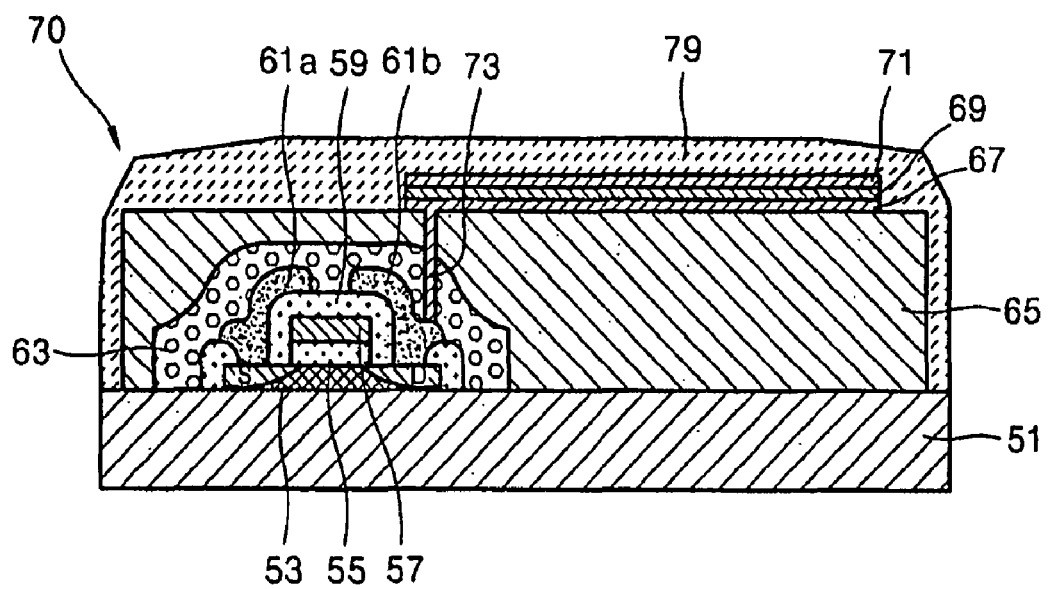
FIG. 2 illustrates a sectional view of a TFT-LCD as an example of a semiconductor device and an electronic device using the same according to a first embodiment of the present invention.

FIG. 2 illustrates a sectional view of a thin film transistor-liquid crystal display (TFT-LCD) as an example of a semiconductor device and an electronic device using the same according to a first embodiment of the present invention.

Referring to FIG. 2, an LCD is used as a pixel unit including a first electrode 67, a second electrode 71, and a liquid crystal layer 69 interposed between the first and the second electrodes 67 and 71. Here, an organic light emitting diode (OLED) may be substituted for the LCD.

A driving unit as a switching unit, which drives the pixel unit, uses a TFT semiconductor device. The driving unit includes a flexible substrate 51, an active layer 53 formed on an upper surface of the substrate 51 and having a source region S and a drain region D, a first insulating layer 55 and a gate electrode 57 deposited on an upper surface of the active layer 53, a second insulating layer 59 covering the surface of the gate electrode 57 and portions of the active layer 53, a source electrode 61a and a drain electrode 61b formed on the second insulating layer 59 to connect the source and the drain regions S and D of the active layer 53 and to transfer electrons and holes, and a protective cap 63 coated on surfaces of the substrate 51, the active layer 53, the second insulating layer 59, and the source and the drain electrodes 61a and 61b in order to protect the entire structure.

A third insulating layer 65 interposed between the pixel unit and the driving unit is formed on the surfaces of the substrate 51 and the protective cap 63 to protect the TFT semiconductor device from the outside while insulating the pixel unit from the driving unit. A contact hole 73 formed through the third insulating layer 65 and the protective cap 63 to the surface of the drain electrode 61b is filled with a same material as that of the first electrode 67. The pixel unit and the driving unit are sealed using a sealing cap 79 and are connected to a backlight (not shown) to complete the TFT-LCD 70. Here, a thin film diode (TFD) may be substituted for the TFT.

It is preferable that the protective cap 63 is formed of a material having a tensile strength higher than about 30 GPa and a hardness higher than about 200 Brinell. Examples of materials that may be used as the protective cap include an ultraviolet curing material, an X-ray curing material, an ion beam curing material, and an electronic beam curing material according to a curing method.

In a case in which an ultraviolet curing method is used, poly(vinylcinnamate) derivatives, allyl esterprepolymer, cyclized polyisoprene, 2,3-dichloro-1-prophyacrylate, polyvinylphenol, and an allylic-based material or an acrylic-based material as a polyimide precursor may be used.

In a case in which an X-ray curing method is used, poly(dially-orthophthalate) (PDOP), poly(glycidyl methacrylate-co-ethyl acrylate) (COP), poly(2,3-dichloro-1-propylacrylate) (DCPA), DCOPA (DCPA+COP), DCPA+N-vinyl carbazole, poly(2,3-dibromo-1-propylacrylate-co-glycidylacrylate), poly(chloroethylvinylether-co-vinyloxyethylacrylate), AgBr emuls, Brominated tetrathia-fulvalene-fuctionalized polystyrene, hydrocarbon resist, metal acrylate, poly(glycidyl methacrylate-EA) (PGMA-EA), SEL-N, OEBR, CER, DCPA-Monomer mixtures, DCPA-BABTDS, DCPA-DPDVS, DCPA-BMBTDS, DCPA-NVC, DCPA-NVC-DPDVS, DCPA-(2-(1-naphthyl)-ethyl methacrylate and acrylate), DCPA-NPM(N-phenyl maleimide), polymer containing N-vinyl carbazole monomer, poly(2,3-dichloro-1-propyl methacrylate), poly(2-chloroethylacrylate), poly(2,2,2-trichloroethylacrylate), poly(1,3-dichloro-2-propylacrylate), and poly(2,3-dichloro-1-propylacrylate) may be used.

In a case in which an ion beam curing method is used, cyclized rubber with N-phenylmaleimide, Novolac, poly(vinyl chloride) (PVC), poly(vinyl formal) (PVF), poly(methyl methacrylate) (PMMA), $SiO_2$, $Ag_2Se/GeSe_2$, poly(2,3-dibromo-1-propylacrylate-co-2,3-dichloro-propylacrylate), and poly(vinyl carbazole)-trinitro fluorenone complex may be used.

In a case in which an electronic beam curing method is used, poly(styrene) (PS), poly(glycidil methacrylate-co-ethylate) (COP), poly(glycidil methacrylate) (PGMA), poly(diallyl orthophtalate) (PDOP), poly 4-chlorostyrene (P(4Cl-Sty)), poly(2-chlorostyrene) (P(2Cl-Sty)), poly(2,4-chlorostyrene) (P(2&4-ClSty)), poly(vinylacetate), poly(m-ethylvinylketone), poly(vinylcinnamate), poly vinyl chloride (P(VC)), poly vinyl pyrrolidone, poly vinyl toluene (P(VT)), poly vinylbenzylchloride (P(VBCl)), poly(vinylbenzene sulfonic acid) (P(VBSA)), poly(4-iso-propolystyrene), poly(4-terbutylstyrene), poly(4-bromostyrene) (P(4Br-Sty)), copolymer of 4-chlorostyrene and glycidyl methacrylate (copolymers-P(4Cl-Sty-CO-GMA)), copolymer of 3-chlorostyrene and glycidyl methacrylate (P(3Cl-Sty-CO-GMA)), copolymer of chlorostyrene and glycidyl methacrylate (P(ClSty-Co-GMA)), copolymer of, vinyl benzylchloride and glycidyl methacrylate (P(VBCl-CO-GMA)), copolymer of vinyl and glycidyl methacrylate (P(VT-CO-GMA)), epoxidized polybutadiene (EPB), CPB, chloromethylated polystyrene (CMS), and chloromethylated poly-α-methylstyrene (αM-CMS) may be used.

Examples of a method of forming a protective cap according to an embodiment of the present invention are as follows. First, a predetermined organic material is coated using a spin coating or a printing method and the organic material is cured using ultraviolet rays, X-rays, ion beams, or electronic beams. Second, a physical vapor deposition (PVD) method including a sputtering process or an evaporation process is used to deposit, an inorganic material. Third, a predetermined organic material is deposited using a chemical vapor deposition (CVD) method using a plasma enhanced chemical vapor deposition (PECVD), a high density plasma chemical vapor deposition (HDP-CVD), an atomic layer deposition (ALD), or a metal organic chemical vapor deposition (MOCVD), and the predetermined organic material is patterned using a conventional photolithographic process.

Figure 3A:
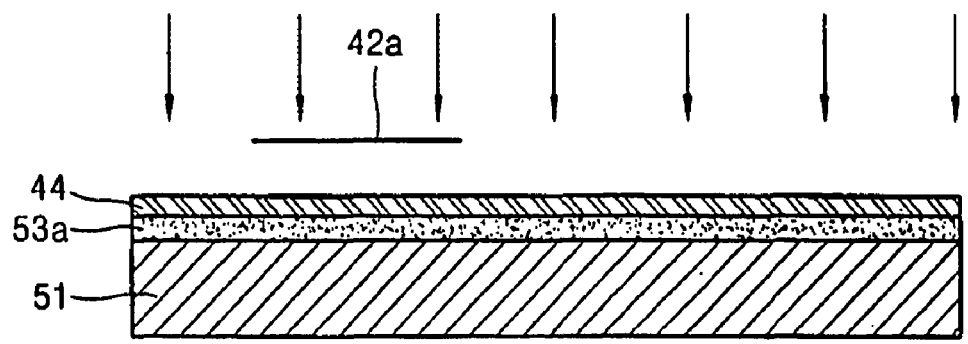
FIGS. 3A through 3P illustrate sectional views for showing stages in a manufacturing method of a TFT-LCD of FIG. 2.
Figure 3B:
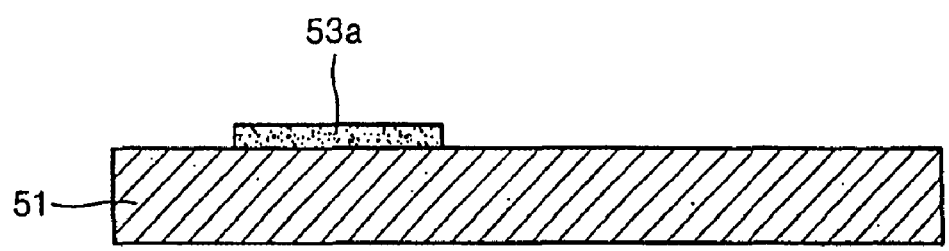
Figure 3C:
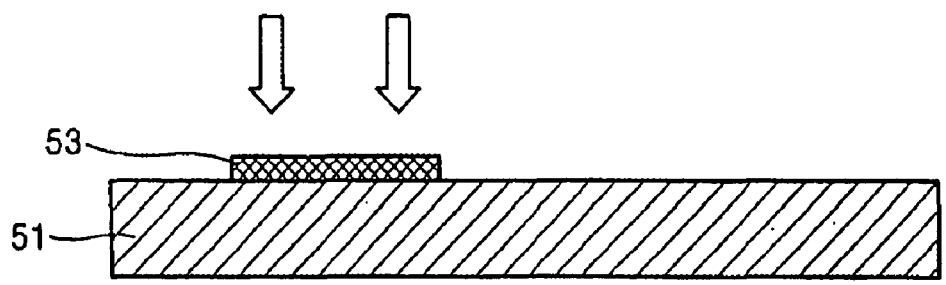
Figure 3D:
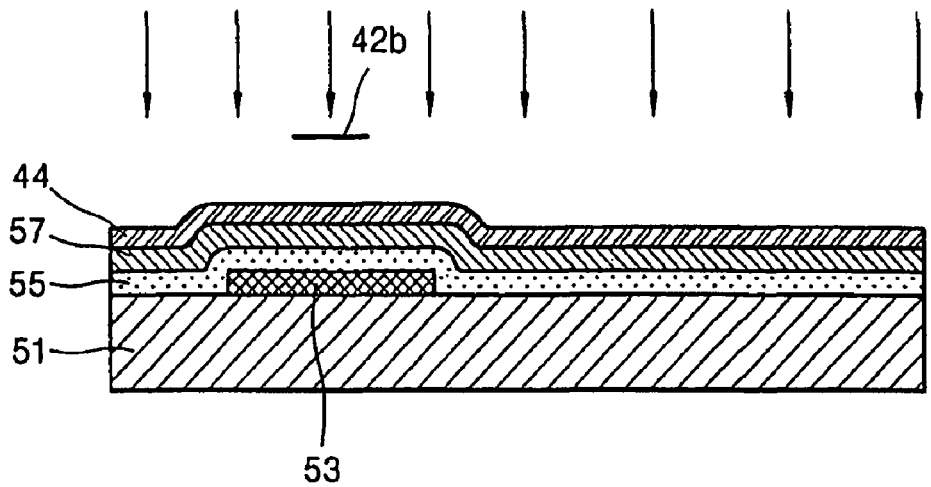
Figure 3E:
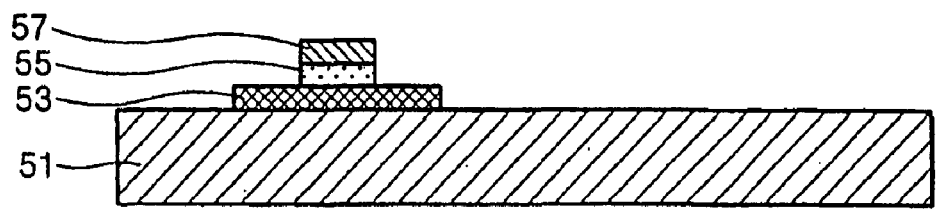
Figure 3F:
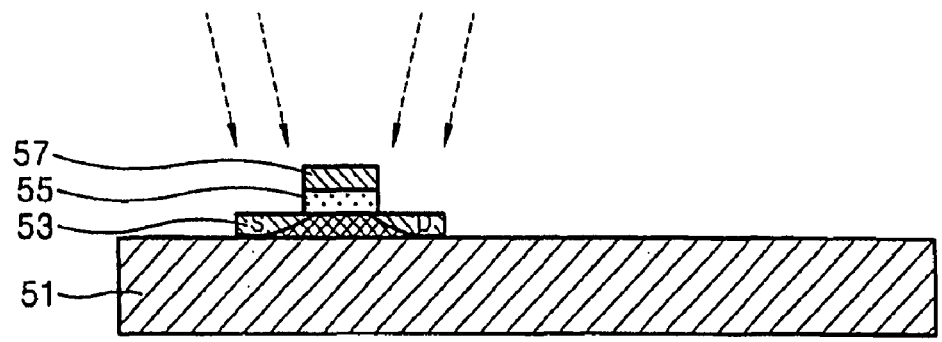
Figure 3G:
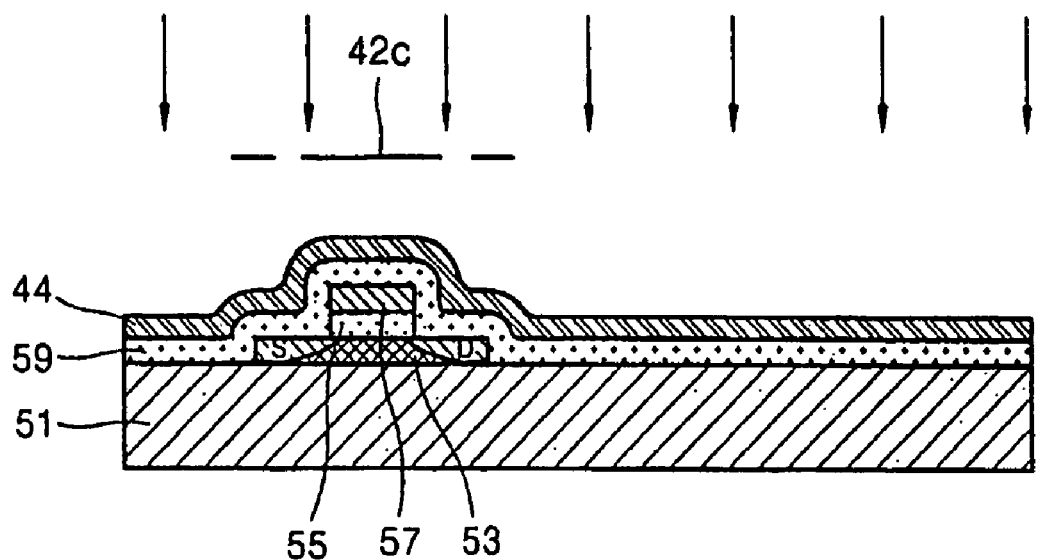
Figure 3H:
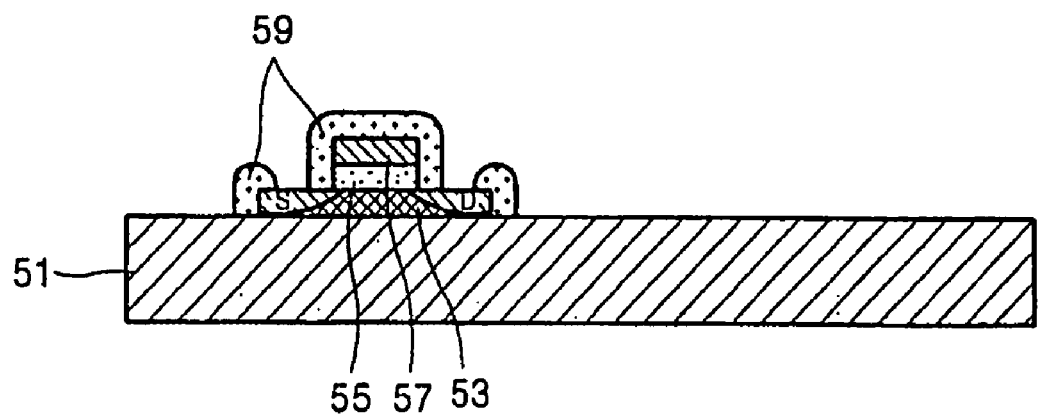
Figure 3I:
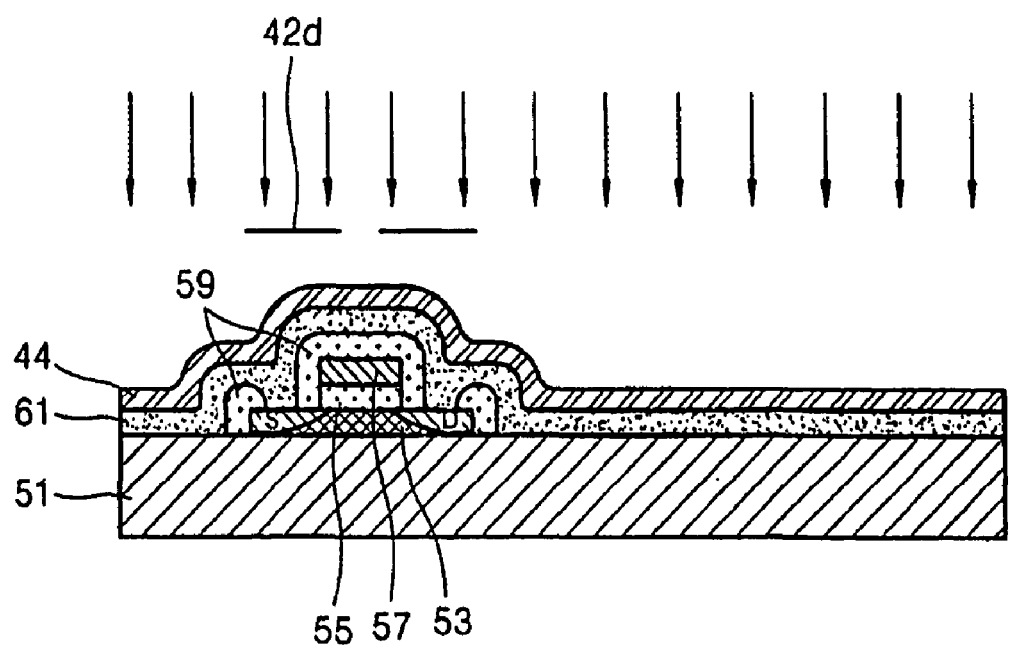
Figure 3J:
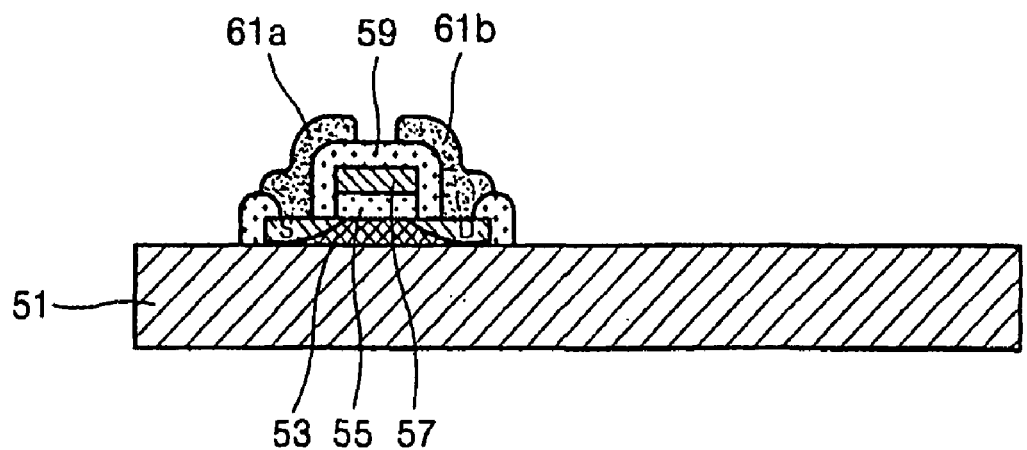
Figure 3K:
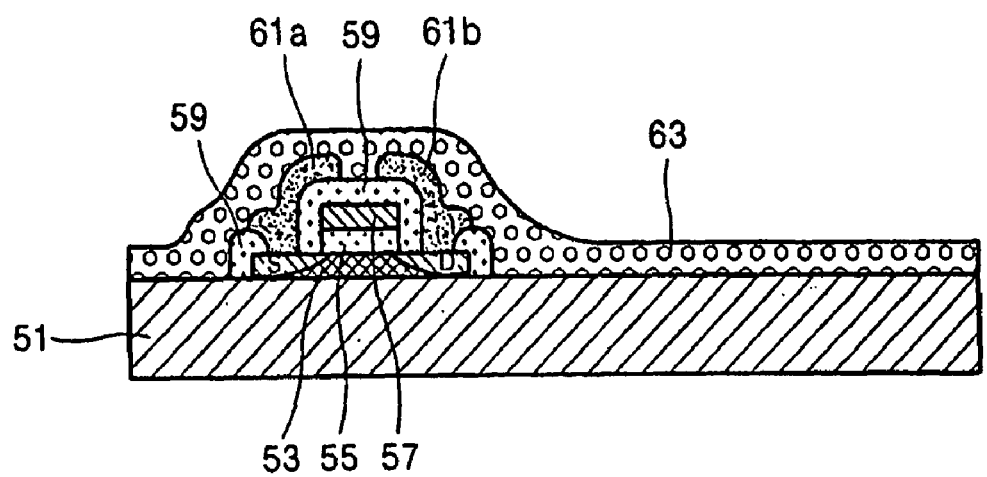
Figure 3L:
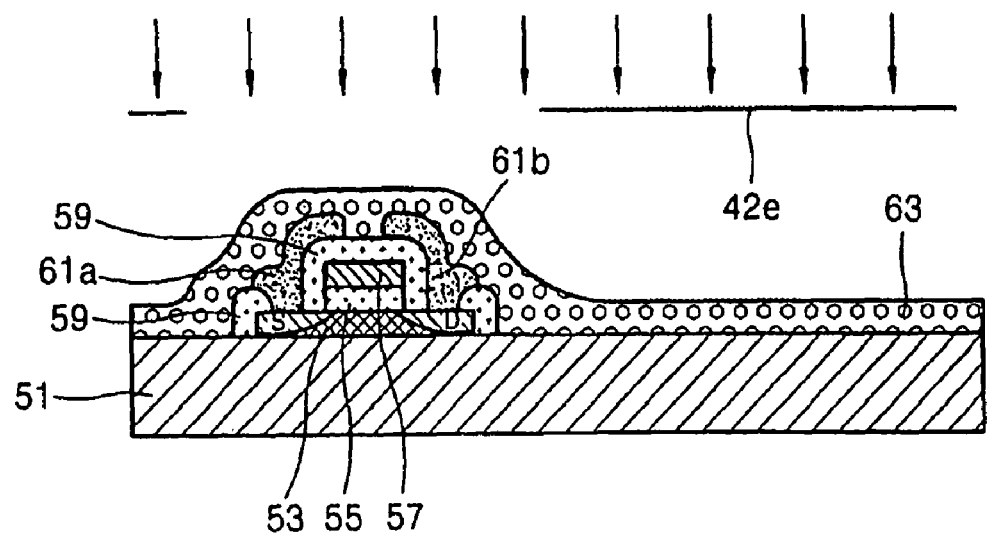
Figure 3M:
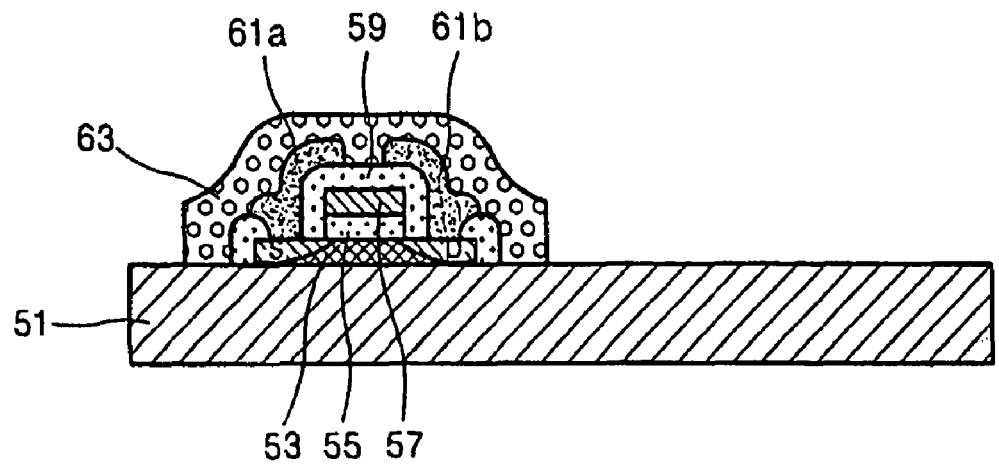
Figure 3N:
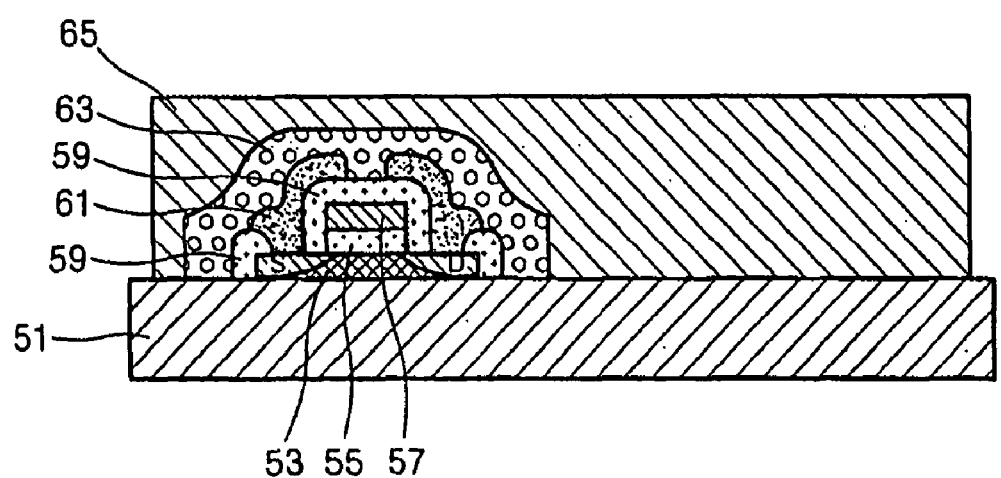
Figure 3O:
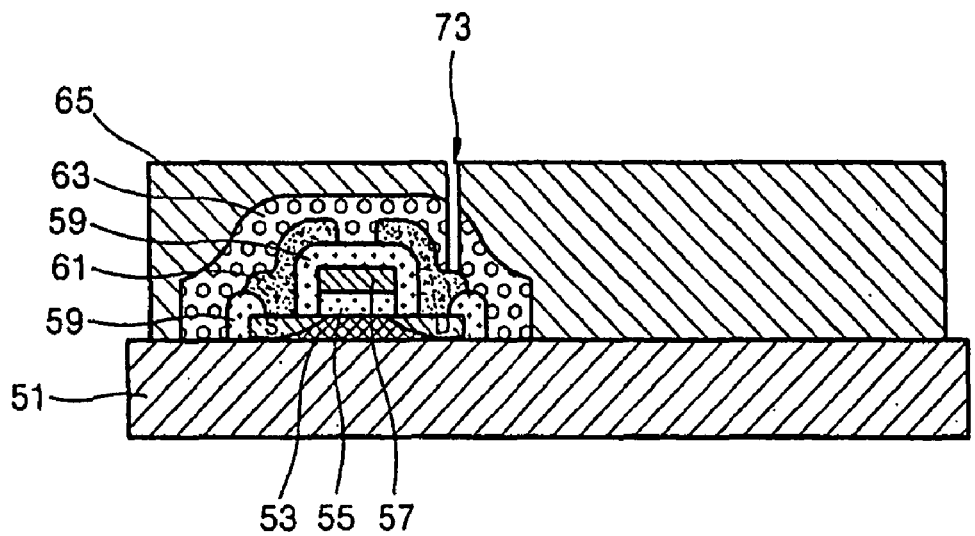
Figure 3P:
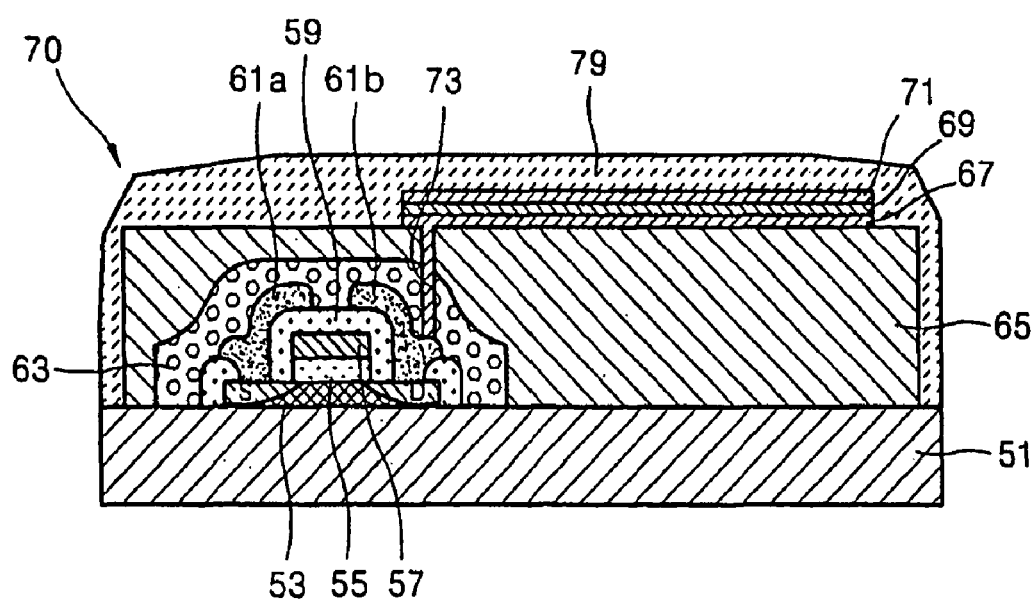

FIGS. 3A through 3P illustrate sectional views for showing stages in a manufacturing method of a semiconductor device according to the first embodiment of the present invention. Here, a protective cap is formed using the ultraviolet curing method.

First, an amorphous silicon layer 53a having a thickness of about 50 nm is deposited on a flexible substrate 51 using an RF sputtering process, and photolithography is performed on the amorphous silicon layer 53a. Here, the photolithography is performed by coating a photoresist 44 on an upper surface of the amorphous silicon layer 53a, positioning a mask 42a above the photoresist 44, and exposing, developing, and etching the photoresist 44 and the amorphous silicon layer 53a. Examples of the flexible substrate 51 include a plastic substrate, such as polyethersulfone (PES), polyacrylate (PAR), polyethylenenaphthelate (PEN), poly methyl methacrylate (PMMA), polyimide (PI), polycarbonate (PC), or polyethylenetherephehalate (PET), a thin metal film, such as aluminum (Al) or steel use stainless (SUS), or a thin glass substrate having a thickness less than about 100 μm. It is preferable that PES is used as the substrate 51 when a process temperature is higher than about 200° C.

When the photolithography is performed, the amorphous silicon layer 53a is patterned according to the shape of the mask 42a on the substrate 51, as shown in FIG. 3B. Thereafter, an excimer laser of 308 nm with an overlapping ratio of 95% is radiated onto the amorphous silicon layer 53a to change the amorphous silicon layer 53a into a crystalline silicon layer and to form an active layer 53, as shown in FIG. 3C.

Referring to FIG. 3D, a first insulating layer 55 formed of $SiO_2$ is deposited on the resultant structure of FIG. 3C using a CVD method. A gate electrode 57 formed of Al is deposited on the first insulating layer 55 using a DC sputtering process. The photoresist 44 is continuously coated on an upper surface of the gate electrode 57. Thereafter, a mask 42b is positioned above the photoresist 44 and photolithography including exposure, development, and etching is performed to pattern the gate electrode 57 and the first insulating layer 55, as shown in FIG. 3E.

After the gate electrode 57 and the first insulating layer 55 are patterned, ions are implanted into the active layer 53 so that a source region S and a drain region D are formed in the active layer 53, as shown in FIG. 3F. Thereafter, the source and the drain regions S and D are activated using the excimer laser. Referring to FIG. 3G, a second insulating layer 59 as an interlevel dielectric (ILD) layer is deposited on the resultant structure of FIG. 3F, and the photoresist 44 is coated on the second insulating layer 59. Thereafter, a mask 42c having a predetermined shape is positioned above the photoresist 44 and photolithography is performed. Accordingly, the second insulating layer 59 is patterned to expose portions of the source and the drain regions S and D of the active layer 53, as shown in FIG. 3H.

Referring to FIG. 3I, an electrode layer 61 of Al is deposited on the resultant structure of FIG. 3H to electrically connect the source and the drain regions S and D. Next, the photoresist 44 is deposited on the electrode layer 61, and a photolithography is performed after positioning a mask 42d having a predetermined shape above the photoresist 44. Accordingly, the central portion of the electrode layer 61 is etched and the electrode layer 61 is divided into a source electrode 61a and a drain electrode 61b, as shown in FIG. 3J. Here, the source and drain electrodes 61a and 61b electrically connect the source and the drain regions S and D, respectively.

In order to protect a thin film semiconductor chip of FIG. 3J and insulate the source and the drain electrodes 61a and 61b, a protective cap 63 is spin coated on the resultant structure of FIG. 3J, as shown in FIG. 3K. Here, the protective cap 63 is formed of an ultraviolet curing resin, such as an acrylic resin or an epoxy resin.

The protective cap 63 is soft baked at a temperature of about 90° C. for about three minutes. Thereafter, a mask 42e having a predetermined shape is positioned above the protective cap 63 and ultraviolet rays are radiated as shown in FIG. 3L. By developing the protective cap 63 after radiating the ultraviolet rays, the protective cap 63 is patterned as shown in FIG. 3M. The patterned protective cap 63 is hard baked at a temperature of about 150° C. for about ten minutes, and is argon plasma processed. Thereafter, an inorganic third insulating layer 65 is deposited on the substrate 51 and the protective cap 63, as shown in FIG. 3N. Here, the argon plasma process is performed to prevent an adhesive force from being weakened when depositing the inorganic third insulating layer 65 on the organic protective cap 63.

Referring to FIG. 3O, a contact hole 73 is formed to penetrate the third insulating layer 65 and the protective cap 63. Referring to FIG. 3P, indium tin oxide (ITO) as a display electrode of a pixel unit is deposited on the third insulating layer 65 to form a first electrode 67. Thereafter, a liquid crystal layer 69 and a second electrode 71 are sequentially formed on the first electrode 67 to construct the pixel unit, and a sealing cap 79 for sealing the pixel unit and the driving unit is coated so that a TFT-LCD 70 is completed.

Figure 4:
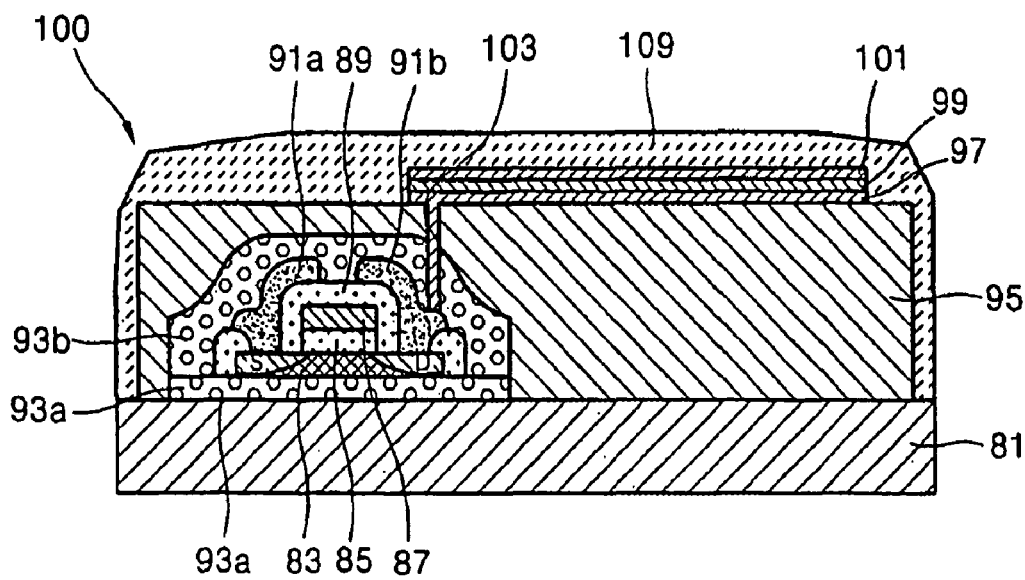
FIG. 4 illustrates a sectional view of a TFT-LCD as an example of a semiconductor device and an electronic device using the same according to a second embodiment of the present invention.

FIG. 4 illustrates a sectional view showing a TFT-LCD as an example of a semiconductor device and an electronic device using the same according to a second embodiment of the present invention.

The structure of a TFT-LCD 100 of FIG. 4 is similar to that of the TFT-LCD 70 of FIG. 2. However, the semiconductor device according to the second embodiment of the present invention further includes a first protective cap 93a between a substrate 81 and an active layer 83 in addition to a second protective cap 93b formed under a third insulating layer 95. Reference numerals 85, 87, 89, 91a, 91b, 95, 97, 99, and 101 denote a first insulating layer, a gate electrode, a second insulating layer, a source electrode, a drain electrode, a third insulating layer, a first electrode, a liquid crystal layer, and a second electrode, respectively. Since the semiconductor device and the electronic device using the same according to the second embodiment of the present invention further includes the first protective cap 93a between the substrate 81 and the active layer 93 along with the second protective cap 93b, durability against stress due to bending of the substrate 81 may be enhanced.

Figure 5A:
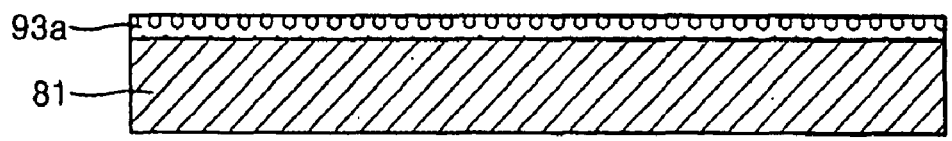
FIGS. 5A through 5S illustrate sectional views for showing stages in a manufacturing method of a TFT-LCD of FIG. 4.
Figure 5B:
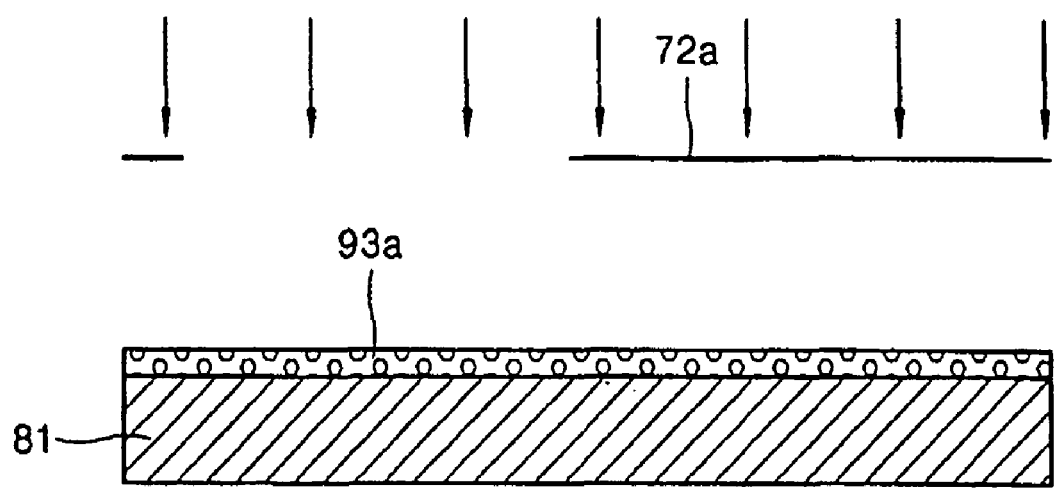
Figure 5C:
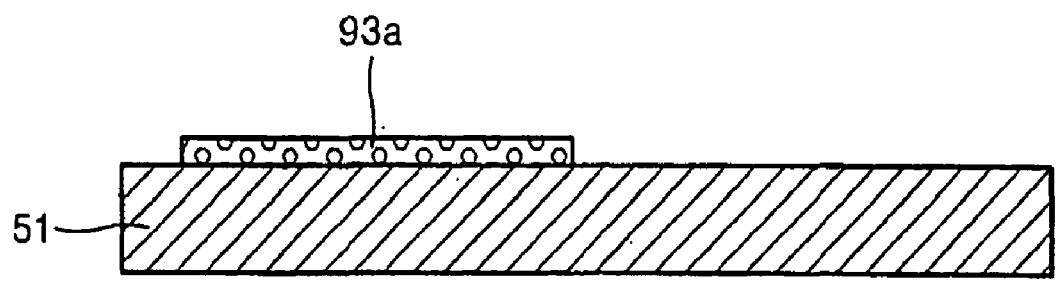
Figure 5D:
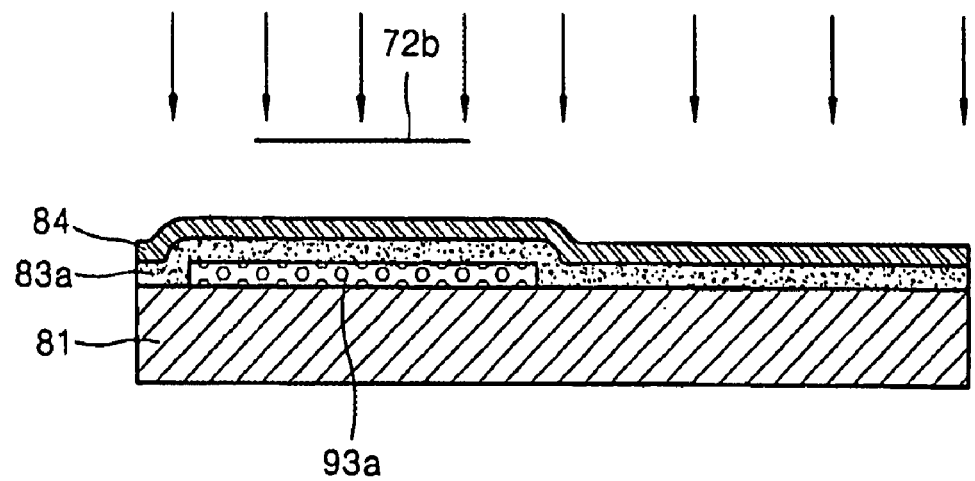
Figure 5E:
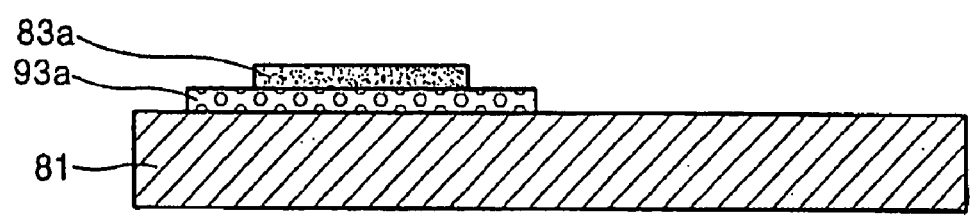
Figure 5F:
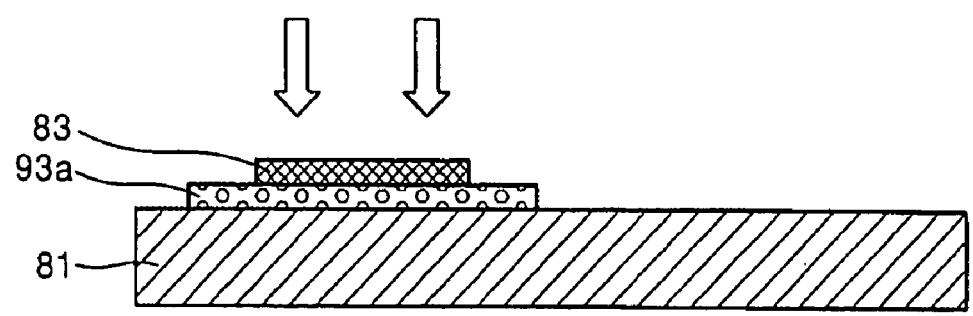
Figure 5G:
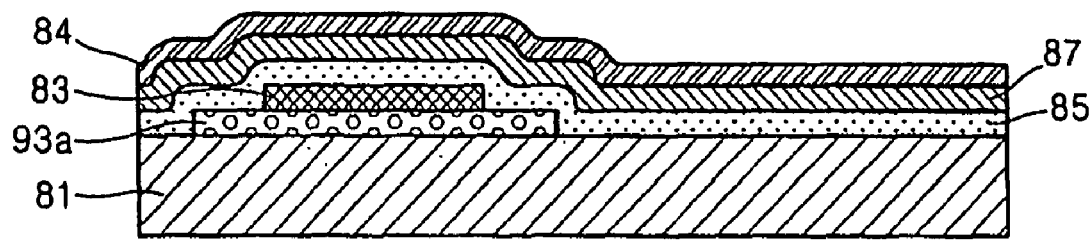
Figure 5H:
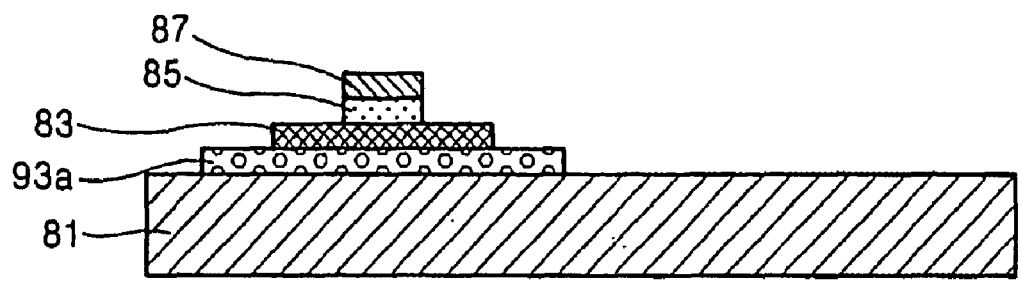
Figure 5I:
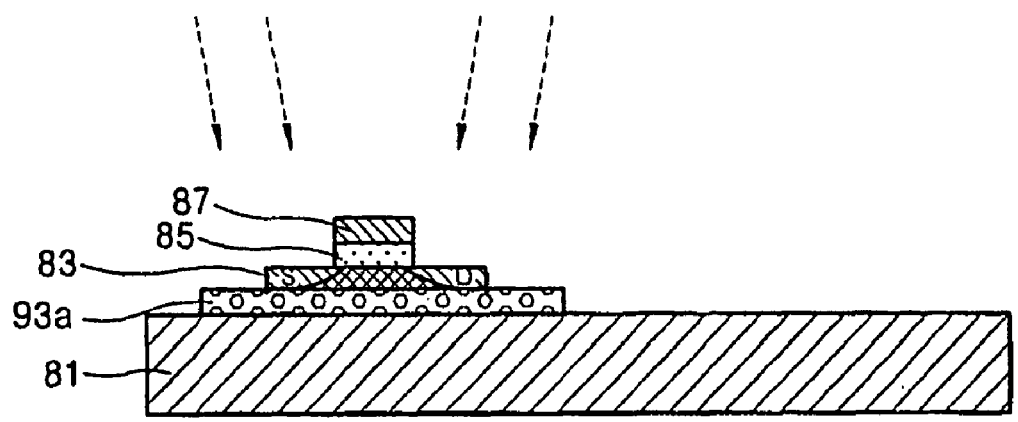
Figure 5J:
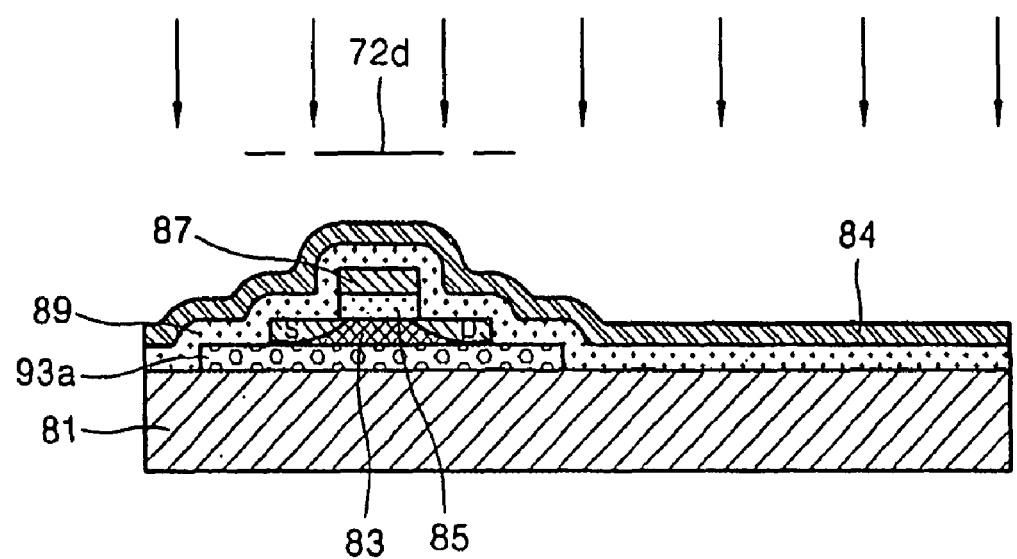
Figure 5K:
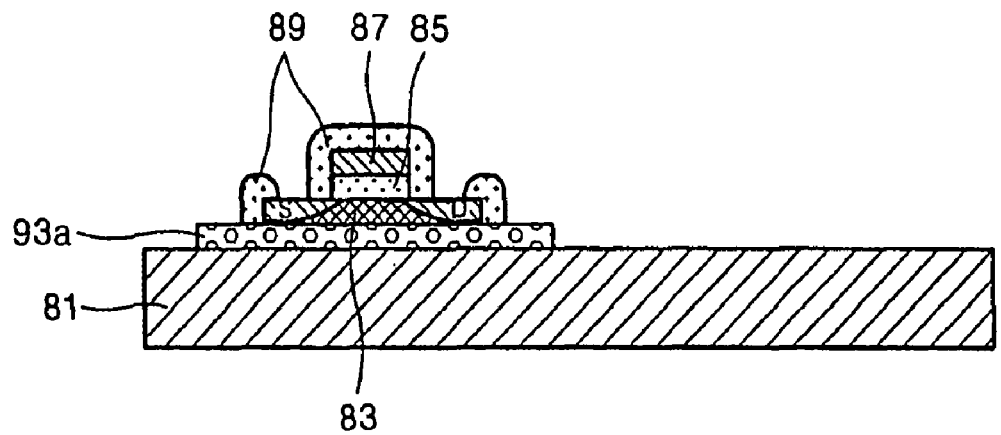
Figure 5L:
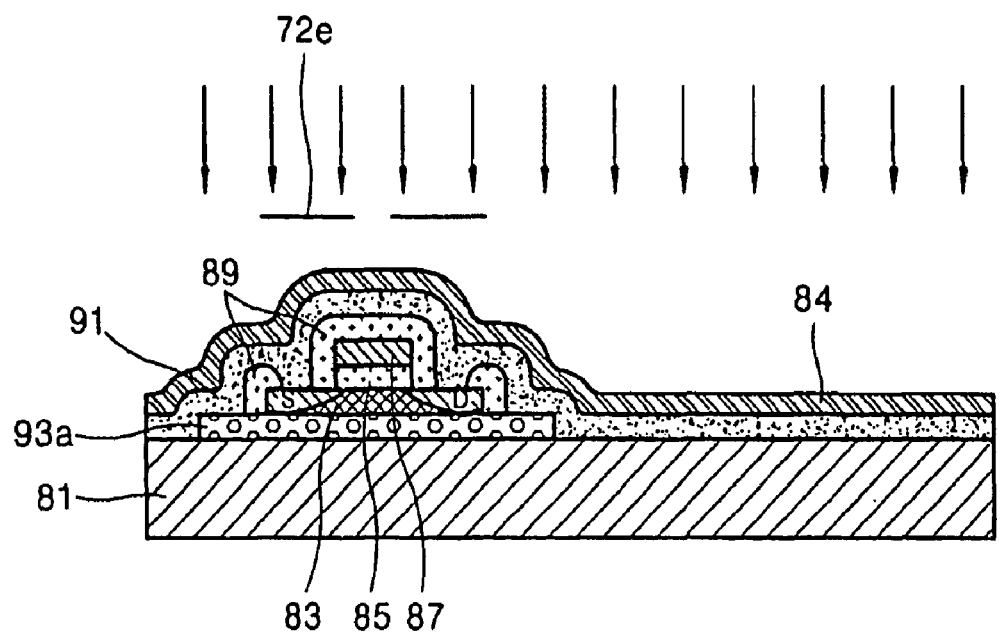
Figure 5M:
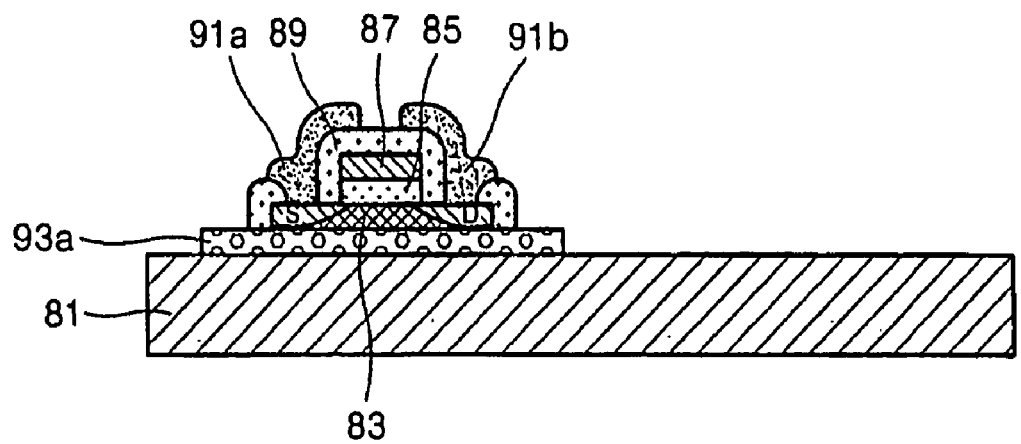
Figure 5N:
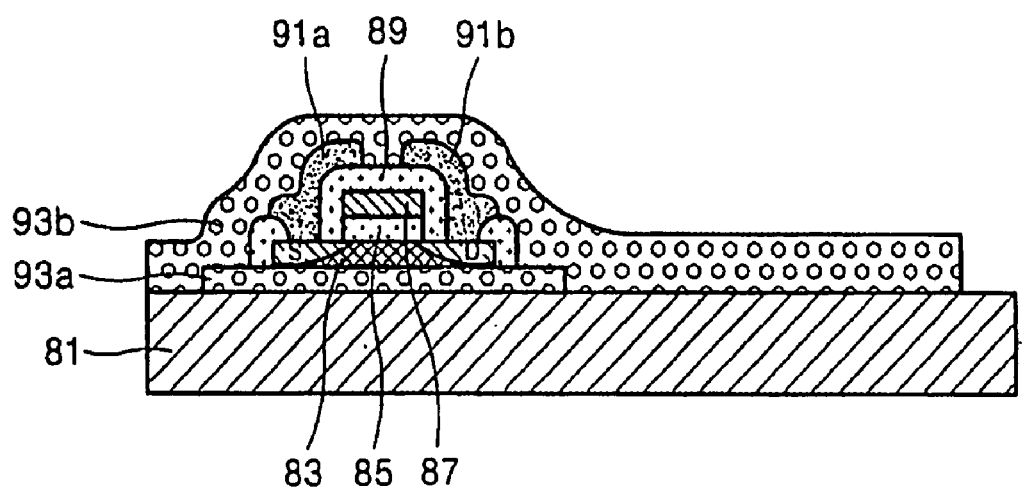
Figure 5O:
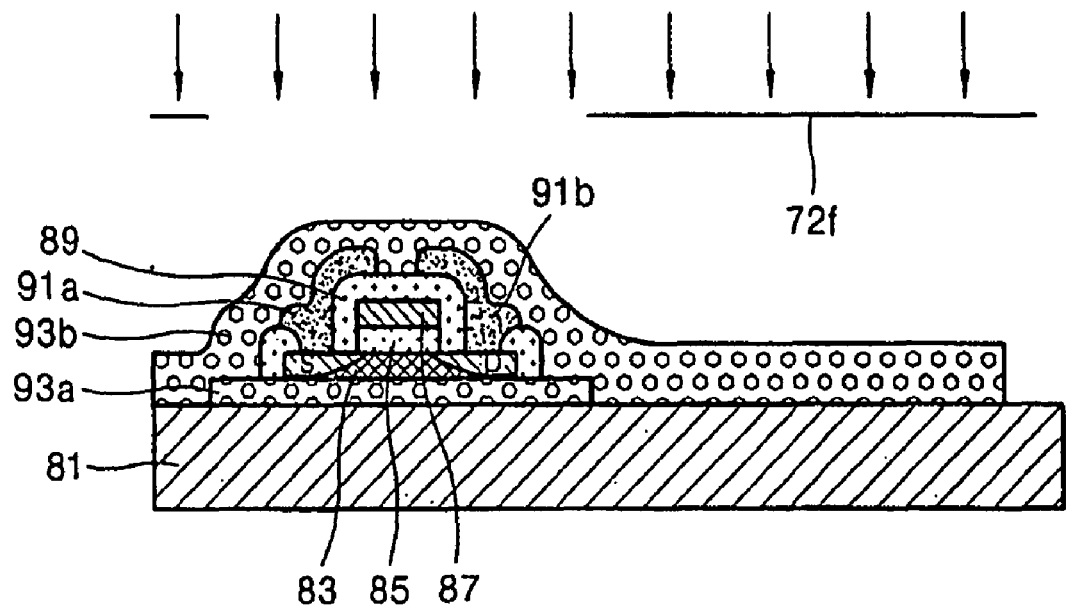
Figure 5P:
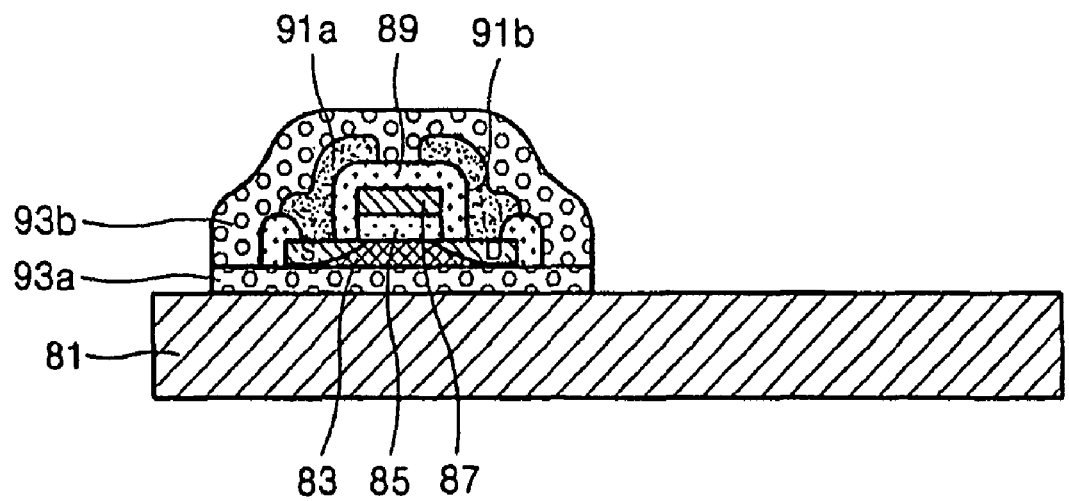
Figure 5Q:
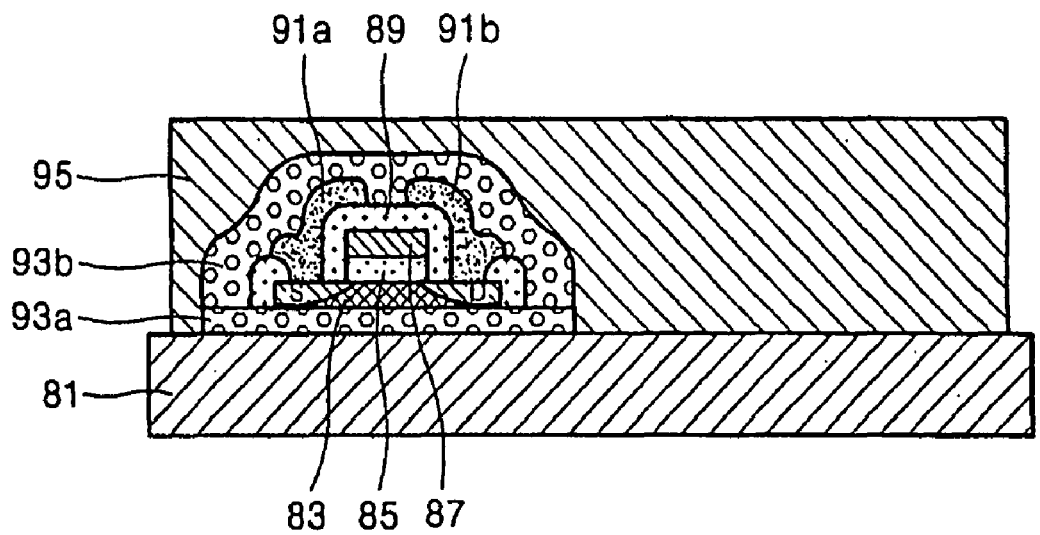
Figure 5R:
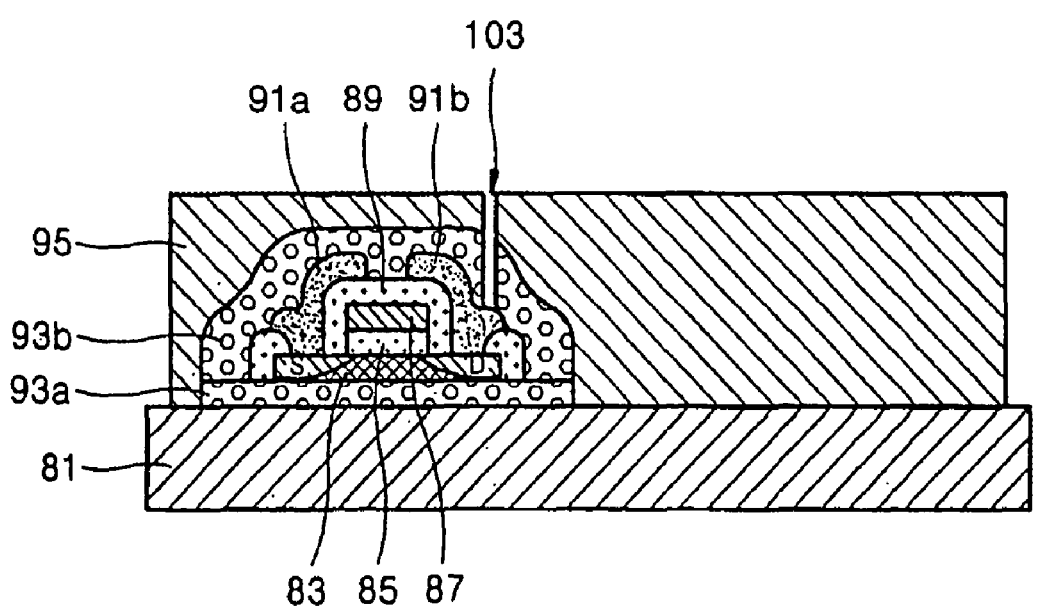
Figure 5S:
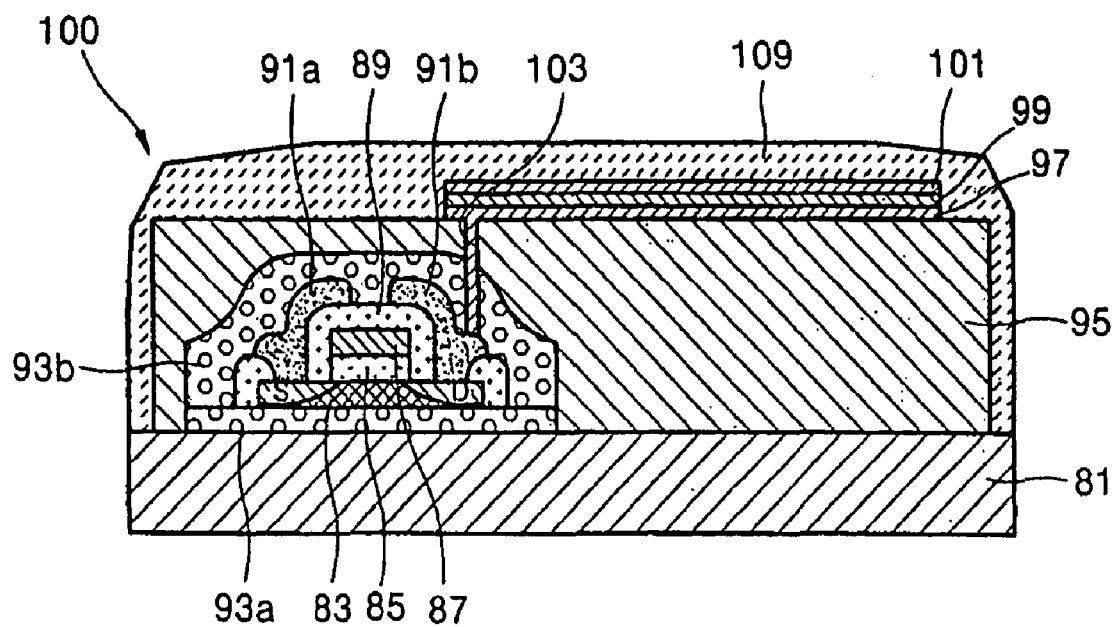

FIGS. 5A through 5S illustrate sectional views for showing stages in a manufacturing method of a semiconductor device according to the second embodiment of the present invention.

Referring to FIG. 5A, an ultraviolet curing resin is coated on a flexible substrate 81 using a spin coating method so that a first protective cap 93a is formed. The first protective cap 93a is soft baked at a temperature of about 90° C. for about three minutes. Thereafter, a mask 72a is positioned above the first protective cap 93a, and ultraviolet rays are radiated onto selected portions thereof for about 10 seconds, as shown in FIG. 5B. Then, the first protective cap 93a is dipped into a development solution to remove unexposed portions of the first protective cap 93a. Thereafter, the patterned first protective cap 93a is hard baked at a temperature of about 150° C. for about ten minutes and argon plasma is processed.

Next, an amorphous silicon layer 83a having a thickness of about 50 nm is deposited on the first protective cap 93a using an RF sputtering process, and photolithography is performed on the amorphous silicon layer 83a. Accordingly, the patterned amorphous silicon layer 83a is formed as shown in FIG. 5E. In FIG. 5D, reference numeral 72b denotes a mask and reference numeral 84 denotes a photoresist.

Referring to FIG. 5F, the amorphous silicon layer 83a is crystallized by radiating an excimer laser having a wavelength of 308 nm with an overlapping ratio of 95%. When an active layer 83 is formed using the crystallized silicon, a second insulating layer 85 is deposited on the active layer 83, the first protective cap 93a, and the exposed portions of the substrate 81 using a CVD method, as shown in FIG. 5G. Thereafter, a gate electrode 87 is deposited on the second insulating layer 85 using a DC sputtering process. A photoresist 84 is coated on the gate electrode 87, and photolithography is performed on the photoresist 84. Accordingly, the second insulating layer 85 and the gate electrode 87 are patterned so that a channel region is formed, as shown in FIG. 5H. Here, reference numeral 72c of FIG. 5G denotes a mask.

Referring to FIG. 5I, a source region S and a drain region D are formed in the active layer 83 by implanting ions to the active layer 83. Thereafter, the excimer laser is radiated to activate the source and the drain regions S and D. Referring to FIG. 5J, a second insulating layer 89 as an ILD layer is deposited on the resultant structure of FIG. 5I, and photolithography is performed using a photoresist 84 and a mask 72d. Accordingly, portions of the second insulating layer 89 contacting the source and drain regions S and D are removed, as shown in FIG. 5K. A source electrode 91a and a drain electrode 91b will be formed in the portions at which the second insulating layer 89 is removed in order to electrically connect the source and the drain regions S and D.

Referring to FIG. 5L, a metal gate electrode layer 91 is deposited on the resultant structure of FIG. 5K and photolithography is performed on the gate electrode layer 91 using a photoresist 84 and a mask 72e. Referring to FIG. 5M, the gate electrode layer 91 is patterned to form a source electrode 91a and a drain electrode 91b. Referring to FIG. 5N, a second protective cap 93b is deposited on the resultant structure of FIG. 5M using a spin coating method, and soft baked. Referring to FIG. 5O, a mask 72f having a predetermined shape is positioned above the second protective cap 93b to radiate ultraviolet rays to selected portions of the second protective cap 93b. By performing a developing process after the radiation of the ultraviolet rays, the second protective cap 93b is patterned, as shown in FIG. 5P. The patterned second protective cap 93b is hard baked and argon plasma is processed. The conditions of the patterning process of the second protective cap 93b are the same as those of the first protective cap 93a.

After a TFT as an example of the semiconductor device according to the second embodiment of the present invention is formed, a third insulating layer 95 is deposited on the substrate 81 and the second protective cap 93b, as shown in FIG. 5Q. Referring to FIG. 5R, a contact hole 103 is formed through the third insulating layer 95 and the second protective cap 93b to the surface of the drain electrode 91b.

Referring to FIG. 5S, a first electrode 97, as a display electrode formed of ITO, is formed on the third insulating layer 95, and a liquid crystal layer 99 and an ITO second electrode 101 are sequentially formed on the first electrode 97 to form a pixel unit. A sealing cap 109 is formed on the pixel unit and a driving unit to complete a TFT-LCD.

As described above, TFTs are examples of semiconductor devices according to the first and the second embodiments of the present invention. However, thin film diodes (TFDs) or metal insulator metals (MIMs) may be also used as semiconductor devices.

The durability of a semiconductor device as disclosed in the first and second embodiments and an electronic device using the same may be improved by forming a protective cap to protect the semiconductor device.

Figure 6:
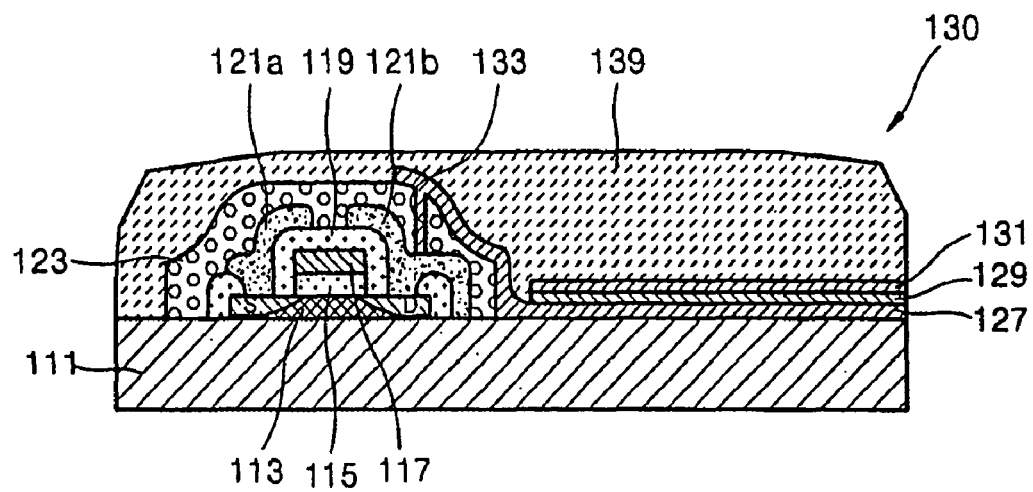
FIG. 6 illustrates a sectional view of a TFT-LCD as another example of a semiconductor device and an electronic device using the same according to the first embodiment of the present invention.
Figure 7:
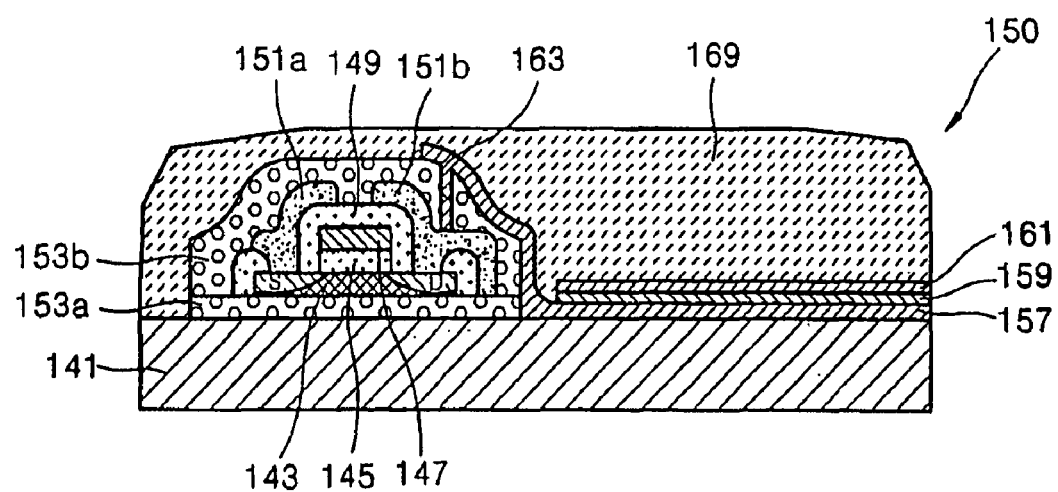
FIG. 7 illustrates a sectional view showing a TFT-LCD as another example of a semiconductor device and an electronic device using the same according to the second embodiment of the present invention.

FIG. 6 illustrates a sectional view showing a TFT-LCD as another example of a semiconductor device and an electronic device using the same according to the first embodiment of the present invention. FIG. 7 illustrates a sectional view showing a TFT-LCD as another example of a semiconductor device and an electronic device using the same according to the second embodiment of the present invention.

In the TFT-LCDs of FIGS. 6 and 7, first electrodes 127 and 157 as display electrodes are filled in contact holes 133 and 163 that penetrate a protective cap 123 and a second protective cap 153b, respectively, to connect respective drain electrodes 121b and 151b while not including third insulating layers. Here, reference numerals 111 and 141 denote flexible substrates, reference numerals 113 and 143 denote active layers, reference numerals 115 and 145 denote first insulating layers, reference numerals 117 and 147 denote gate electrodes, reference numerals 119 and 149 denote second insulating layers, reference numerals 121a and 151a denote source electrodes, reference numerals 129 and 159 denote liquid crystal layers, reference numerals 131 and 161 denote second electrodes, and reference numerals 139 and 169 denote sealing caps.

The thin film semiconductor device and the electronic device using the same, manufactured as described above, provide the advantage of improved durability against external stress by using the protective cap that seals the thin film semiconductor device.

Preferred embodiments of the present invention have been disclosed herein and, although specific terms are employed, they are used and are to be interpreted in a generic and descriptive sense only and not for purpose of limitation. For example, a person of ordinary skill in the art may form a protective cap on various electronic devices using thin film semiconductor devices. Accordingly, it will be understood by those of ordinary skill in the art that various changes in form and details may be made without departing from the spirit and scope of the present invention as set forth in the following claims.

What is claimed is:

1. A manufacturing method of an electronic device, the method comprising:
    coating a first protective cap on a flexible substrate;
    patterning the first protective cap into a pattern;
        manufacturing a thin film semiconductor device on the flexible substrate including the first protective cap;
        coating a second protective cap to seal the semiconductor device;
        forming a contact hole that penetrates the second protective cap in the upper surface of the semiconductor device; and
        forming an electrode to be electrically connected to the semiconductor device through the contact hole, and forming a driving unit on the electrode, the driving unit being driven by the semiconductor device,
    wherein the first and second protective caps are one selected from the group consisting of an ultraviolet curing resin, an X-ray curing material, an electronic beam curing material, and an ion beam curing material.

2. The method as claimed in claim 1, further comprising:
    before the forming of the contact hole, depositing an insulating layer on the substrate to cover the second protective cap.

3. The method as claimed in claim 2, wherein the depositing of the insulating layer includes depositing the insulating layer on the substrate after performing an argon plasma process on the second protective cap.

4. The method as claimed in claim 1, wherein a tensile strength of the second protective cap is greater than about 30 GPa.

5. The method as claimed in claim 1, wherein a hardness of the second protective cap is greater than about 200 Brinell.

6. The method as claimed in claim 2, wherein the flexible substrate is formed of any one of plastic and a thin metal film.

7. The method as claimed in claim 1, wherein the flexible substrate is a glass substrate having a thickness less than about 100 μm.

8. The method as claimed in claim 1, wherein the semiconductor device is one selected from the group consisting of a thin film transistor (TFT), a thin film diode (TFD), and a metal insulator metal (MIM).

9. The method as claimed in claim 1, wherein the driving unit is a pixel unit of an LCD.

10. The method as claimed in claim 1, wherein the driving unit is a pixel unit of an OLED.

11. The method as claimed in claim 1, wherein the coating of the second protective cap includes:
    spin coating the ultraviolet curing resin on the semiconductor device;
    baking the ultraviolet curing resin at a low temperature and radiating ultraviolet rays to a portion of the semiconductor device to cure a portion of the ultraviolet curing resin; and
    performing a development process to remove the remaining ultraviolet curing resin, and performing a heating process at a high temperature to form the second protective cap.

12. The method as claimed in claim 1, further comprising:
    before the forming of the contact hole, depositing an insulating layer on the second protective cap and the substrate.

13. The method as claimed in claim 1, wherein a tensile strength of each of the first and second protective caps is greater than about 30 GPa.

14. The method as claimed in claim 1, wherein a hardness of each of the first and second protective caps is greater than about 200 Brinell.

15. The method as claimed in claim 1, wherein the coating of the first protective cap includes:
    spin coating an ultraviolet curing resin on the substrate;
    baking the ultraviolet curing resin at a low temperature and radiating ultraviolet rays to a portion of the substrate to cure a portion of the ultraviolet curing resin; and
    performing a development process to remove the remaining ultraviolet curing resin, and performing a heating process at a high temperature to pattern the first protective cap.

16. The method as claimed in claim 15, wherein the manufacturing of the thin film semiconductor device includes manufacturing the thin film semiconductor device after performing an argon plasma process on the first protective cap.

17. The method as claimed in claim 16, wherein the coating of the second protective cap includes:
    spin coating the ultraviolet curing resin on the semiconductor device;
    baking the ultraviolet curing resin at a low temperature and radiating ultraviolet rays to a portion of the semiconductor device to cure a portion of the ultraviolet curing resin; and performing a development process to remove the remaining ultraviolet curing resin; and
    performing a heating process at a high temperature to form the second protective cap.

* * * * *